US008437908B2

(12) United States Patent
Goff et al.

(10) Patent No.: US 8,437,908 B2
(45) Date of Patent: May 7, 2013

(54) BATTERY MONITOR SYSTEM ATTACHED TO A VEHICLE WIRING HARNESS

(75) Inventors: Lonnie Calvin Goff, Tempe, AZ (US); Michael Conley, Thousand Oaks, CA (US); Mark Eidson, Tempe, AZ (US)

(73) Assignee: 4 Peaks Technology LLC, Tempe, AZ (US)

( * ) Notice: Subject to any disclaimer, the term of this patent is extended or adjusted under 35 U.S.C. 154(b) by 793 days.

(21) Appl. No.: 12/075,212

(22) Filed: Mar. 10, 2008

(65) Prior Publication Data

US 2009/0228171 A1 Sep. 10, 2009

(51) Int. Cl.
*G01M 17/00* (2006.01)

(52) U.S. Cl.
USPC .......................................... 701/33.4; 702/63

(58) Field of Classification Search .............. 701/29, 701/35, 29.1, 31.4, 31.9, 33.2, 33.3, 33.4, 701/33.6, 33.7, 33.8, 34.4, 33.9; 340/636.12, 340/636.13, 636.19, 455; 702/63
See application file for complete search history.

(56) References Cited

U.S. PATENT DOCUMENTS

| 3,440,100 | A | | 4/1969 | Ardanuy et al. |
| 4,012,681 | A | * | 3/1977 | Finger et al. .................. 320/109 |
| 4,229,687 | A | | 10/1980 | Newman |
| 4,234,840 | A | | 11/1980 | Konrad et al. |
| 4,289,836 | A | | 9/1981 | Lemelson |
| 4,388,584 | A | | 6/1983 | Dahl et al. |
| 4,564,798 | A | | 1/1986 | Young |
| 4,586,788 | A | * | 5/1986 | Hansen ......................... 359/608 |
| 4,665,370 | A | | 5/1987 | Holland |
| 4,708,918 | A | | 11/1987 | Fitzgerald et al. |
| 4,866,428 | A | | 9/1989 | Hinkle |
| 4,929,931 | A | * | 5/1990 | McCuen .................. 340/636.15 |
| 4,937,528 | A | * | 6/1990 | Palanisamy .................... 324/430 |
| 5,079,716 | A | | 1/1992 | Lenhardt et al. |
| 5,162,741 | A | | 11/1992 | Bates |
| 5,349,535 | A | | 9/1994 | Gupta |
| 5,493,199 | A | | 2/1996 | Koenck et al. |
| 5,495,503 | A | | 2/1996 | King et al. |
| 5,534,759 | A | | 7/1996 | Evans et al. |
| 5,607,794 | A | | 3/1997 | Koenig |
| 5,625,337 | A | * | 4/1997 | Medawar ....................... 340/449 |
| 5,656,919 | A | * | 8/1997 | Proctor et al. ................ 320/153 |
| 5,691,742 | A | | 11/1997 | O'Connor et al. |
| 5,699,050 | A | * | 12/1997 | Kanazawa ............... 340/636.13 |
| 5,710,503 | A | | 1/1998 | Sideris et al. |
| 5,760,587 | A | | 6/1998 | Harvey |
| 5,767,659 | A | | 6/1998 | Farley |
| 5,912,547 | A | | 6/1999 | Grabon |

(Continued)

OTHER PUBLICATIONS

U.S. Appl. No. 12/070,793, Office Action dated Feb. 1, 2011.

(Continued)

*Primary Examiner* — Darnell Jayne
*Assistant Examiner* — Patrick Hawn
(74) *Attorney, Agent, or Firm* — Larry E. Henneman, Jr.; Gregory P. Gibson; Henneman & Associates PLC (57) ABSTRACT

A computer system that installs in the proximity of the vehicle's operator, attaches to the battery power source in the vehicle's wiring harness, gathers information relating to the operational state of the vehicle's battery, calculates the health of the battery from the gathered information, provides the health and operational state of the battery to the vehicle's operator and can include the means for supporting non-battery related functions.

21 Claims, 8 Drawing Sheets

U.S. PATENT DOCUMENTS

| | | | |
|---|---|---|---|
| 6,107,802 | A | 8/2000 | Matthews et al. |
| 6,173,350 | B1 | 1/2001 | Hudson et al. |
| 6,211,644 | B1 | 4/2001 | Wendelrup et al. |
| 6,222,345 | B1 | 4/2001 | Yamanashi |
| 6,400,123 | B1 | 6/2002 | Bean et al. |
| 6,507,169 | B1 | 1/2003 | Holtom et al. |
| 6,549,014 | B1 * | 4/2003 | Kutkut et al. .............. 324/426 |
| 6,611,740 | B2 * | 8/2003 | Lowrey et al. ................ 701/29 |
| 6,710,578 | B1 * | 3/2004 | Sklovsky .................... 320/127 |
| 6,791,464 | B2 | 9/2004 | Huang |
| 6,795,782 | B2 | 9/2004 | Bertness et al. |
| 6,983,212 | B2 | 1/2006 | Burns |
| 7,061,208 | B2 | 6/2006 | Nishihata et al. |
| 7,116,216 | B2 * | 10/2006 | Andreasen et al. .......... 340/438 |
| 7,126,341 | B2 * | 10/2006 | Bertness et al. ............. 324/426 |
| 7,445,870 | B2 | 11/2008 | Taguchi et al. |
| 7,786,851 | B2 * | 8/2010 | Drew et al. .................. 340/438 |
| 7,928,735 | B2 | 4/2011 | Huang et al. |
| 8,102,145 | B2 | 1/2012 | Merrill et al. |
| 2002/0175655 | A1 | 11/2002 | Huykman et al. |
| 2003/0051928 | A1 | 3/2003 | Raftari et al. |
| 2003/0139888 | A1 | 7/2003 | Burns |
| 2004/0056640 | A1 | 3/2004 | Valand |
| 2004/0099846 | A1 | 5/2004 | Lee et al. |
| 2005/0162172 | A1 | 7/2005 | Bertness |
| 2005/0177288 | A1 * | 8/2005 | Sullivan et al. ................ 701/36 |
| 2005/0218902 | A1 | 10/2005 | Restaino et al. |
| 2005/0275383 | A1 | 12/2005 | Ishishita |
| 2006/0028172 | A1 | 2/2006 | Vaillancourt et al. |
| 2006/0043933 | A1 | 3/2006 | Latinis |
| 2006/0118157 | A1 | 6/2006 | Johnson et al. |
| 2006/0152224 | A1 | 7/2006 | Kim et al. |
| 2006/0186857 | A1 | 8/2006 | Matty et al. |
| 2006/0217914 | A1 * | 9/2006 | Bertness ...................... 702/113 |
| 2007/0069734 | A1 * | 3/2007 | Bertness ...................... 324/411 |
| 2007/0075679 | A1 | 4/2007 | Ha et al. |
| 2007/0090844 | A1 * | 4/2007 | Klang .......................... 324/426 |
| 2007/0241614 | A1 | 10/2007 | Busdiecker et al. |
| 2008/0239628 | A1 | 10/2008 | Tatebayashi et al. |
| 2008/0252437 | A1 | 10/2008 | Bertness et al. |
| 2008/0311466 | A1 | 12/2008 | Yang et al. |
| 2009/0100995 | A1 | 4/2009 | Fisher |
| 2009/0144622 | A1 * | 6/2009 | Evans et al. .................. 715/706 |
| 2009/0210736 | A1 | 8/2009 | Goff et al. |
| 2009/0212781 | A1 | 8/2009 | Bertness et al. |
| 2009/0246607 | A1 | 10/2009 | Shinyashiki et al. |
| 2009/0322340 | A1 | 12/2009 | Zhang et al. |
| 2010/0174498 | A1 | 7/2010 | Goff et al. |
| 2010/0179778 | A1 | 7/2010 | Goff et al. |
| 2010/0217551 | A1 | 8/2010 | Goff et al. |
| 2010/0292942 | A1 | 11/2010 | Golf et al. |
| 2011/0048485 | A1 | 3/2011 | Goff et al. |
| 2011/0156648 | A1 | 6/2011 | Goff et al. |
| 2012/0029852 | A1 | 2/2012 | Goff et al. |

OTHER PUBLICATIONS

U.S. Appl. No. 12/070,793, Office Action dated Oct. 13, 2011.
U.S. Appl. No. 12/070,793, Interview Summary dated Feb. 21, 2012.
U.S. Appl. No. 12/319,544, Office Action dated Jul. 20, 2011.
U.S. Appl. No. 12/319,544, Office Action dated Jan. 23, 2012.
U.S. Appl. No. 12/319,544, Interview Summary dated Feb. 24, 2012.
U.S. Appl. No. 12/321,310, Office Action dated Dec. 3, 2010.
U.S. Appl. No. 12/321,310, Final Office Action dated May 9, 2011.
U.S. Appl. No. 12/321,310, Office Action dated Dec. 20, 2011.
U.S. Appl. No. 12/321,310, Interview Summary dated Feb. 17, 2012.
U.S. Appl. No. 12/380,236, Office Action dated May 31, 2011.
U.S. Appl. No. 12/380,236, Office Action dated Jan. 30, 2012.
U.S. Appl. No. 12/454,454, Office Action dated Jun. 13, 2011.
U.S. Appl. No. 12/584,252, Office Action dated Aug. 17, 2011.
U.S. Appl. No. 12/584,252, Office Action dated Jan. 19, 2012.
U.S. Appl. No. 12/319,544, Office Action dated May 25, 2012.
U.S. Appl. No. 12/319,544, Notice of Allowance dated Oct. 16, 2012.
U.S. Appl. No. 12/321,310, Final Office Action dated Apr. 20, 2012.
U.S. Appl. No. 12/321,310, Interview Summary dated Jul. 10, 2012.
U.S. Appl. No. 12/380,236, Office Action dated Sep. 7, 2012.
U.S. Appl. No. 12/454,454, Final Office Action dated Apr. 25, 2012.
U.S. Appl. No. 12/454,454, Notice of Abandon dated Nov. 6, 2012.
U.S. Appl. No. 12/584,252, Notice of Abandon dated Aug. 14, 2012.
U.S. Appl. No. 12/655,275, Office Action dated Apr. 13, 2012.
U.S. Appl. No. 12/655,275, Notice of Allowance dated Nov. 14, 2012.
U.S. Appl. No. 13/272,905, Office Action dated Dec. 21, 2012.
U.S. Appl. No. 12/655,275, Supplemental Notice of Allowance dated Dec. 28, 2012.

* cited by examiner

BATTERY MONITOR SYSTEM ATTACHED TO A VEHICLE WIRING HARNESS

CROSS REFERENCE TO RELATED APPLICATIONS

This application is related to application Ser. No. 12/070,793 filed by the present inventors on Feb. 20, 2008 and entitled "Multi-function Battery Monitor System for Vehicles".

FEDERALLY SPONSORED RESEARCH OR DEVELOPMENT

Not Applicable

SEQUENCE LISTING, TABLE OR COMPUTER PROGRAM LISTING ON CD

Not Applicable

BACKGROUND OF THE INVENTION

1. Field of Invention

The present invention relates to the field of computers. In particular it relates to the gathering and analysis of information that describes the health and operational state of batteries by attaching to a vehicle's wiring harness.

2. Prior Art

All batteries fail. In particular the automobile battery is particularly onerous. Automobile manufactures currently provide only the real-time state of the car's charging system (alternator) when the engine is running. The battery is only one component of this system. This system warns the motorist when there is a problem with the charging system by using a dash mounted voltmeter, ammeter or more commonly a warning lamp which is often referred to as the "idiot light". This information should not be confused nor equated with the operating state or the overall health of the battery, itself. Typically a loose or broken alternator belt causes the warning lamp to come on.

Automobile battery malfunctions are seldom caused by a factory defect; driving habits are the more common culprits. The heavy auxiliary power drawn during a short distance driven never allows the periodic fully saturated charge that is so important for the longevity of a lead acid battery.

A German manufacturer of luxury cars reveals that of every 400 car batteries returned under warranty, 200 are working well and have no problem. Low charge and acid stratification are the most common causes of the apparent failure. The car manufacturer says that the problem is more common on large luxury cars offering power-hungry auxiliary options than on the more basic models.

It would be important to know when the health of a battery has deteriorated sufficiently to signal that a failure is impending. In some situations this information could be life-saving such as when operating in combat zones or under severe weather conditions. It would also be important to know that by merely changing the usage pattern of a vehicle such as combining multiple shopping trips into a single extended trip or by knowing when to apply an external battery charger that the life of the battery would be extended and impending failures avoided.

A system by which the driver of an internal combustion engine automobile, or the skipper of a boat or the driver of a hybrid vehicle or the driver of an electric vehicle can know both the operating state and the general health of their batteries would therefore be desirable.

BRIEF SUMMARY OF THE INVENTION

This invention is cognizant of the economy and facilitation achieved by combining the battery monitor function with non-related systems such as automobile sound systems, tire pressure systems, global positioning systems and theft deterrent systems. All of these different systems contain microprocessors which are typically underutilized. In the $257 billion dollar automotive aftermarket, these systems are sold and installed as single function devices with separate enclosures. Also, given the power requirements of today's microprocessor technology it is not feasible to build self-powered devices using an internal power source such as a 9 v battery. The installation of these systems therefore becomes problematic in that they typically must be wired into the vehicle's wiring harness in order to utilize the vehicle's primary power source. This usually requires the services of a professional installer or skilled technician. Therefore, in order to economize both manufacturing costs and installation costs the combining of battery monitoring with non-battery related functionality in the same enclosure is therefore deemed desirable.

Per one embodiment, the present invention uses a single computer system that takes advantage of an existing wiring harness in order to install remotely from the battery and locally to the operator. The computer system contains facilities for attaching to the battery's power source as delivered through the wiring harness. The computer system has facilities for measuring the battery voltage in the wiring harness and for measuring time. The computer system also includes storage facilities for retaining a history of these measurements. In addition, the computer system contains algorithms for diagnosing the general health of the battery based upon the active and historical measurements. Finally the computer system makes the active state and the health of the battery known to the operator directly through its operator interface.

Per another embodiment, the present invention additionally includes facilities for remotely monitoring the battery's temperature and current. These measurements are included in the algorithms which have the means for diagnosing the general health of the battery based upon active and historical measurements.

Per yet another embodiment, the present invention additionally includes the means for performing non-battery related functions such as receiving global positioning information or tire pressure information and making the vehicle operator aware of this information.

Per still yet another embodiment, the present invention additionally includes the means for the support and means of control for a theft deterrent system or an audio stereo sound system.

DETAILED DESCRIPTION OF THE INVENTION

The following descriptions are provided to enable any person skilled in the art to make and use the invention and is provided in the context of six particular embodiments. Various modifications to the embodiments are possible and the generic principles defined herein may be applied to these and other embodiments without departing from the spirit and scope of the invention. Thus the invention is not intended to be limited to the embodiments shown but is to be accorded the widest scope consistent with the principles, features and teachings disclosed herein.

In accordance with one embodiment, the present invention provides a single-function computer system that attaches to a vehicle's wiring harness at a point that is local to the location of the vehicle's operator but remote from the location of the battery.

Figure 1:
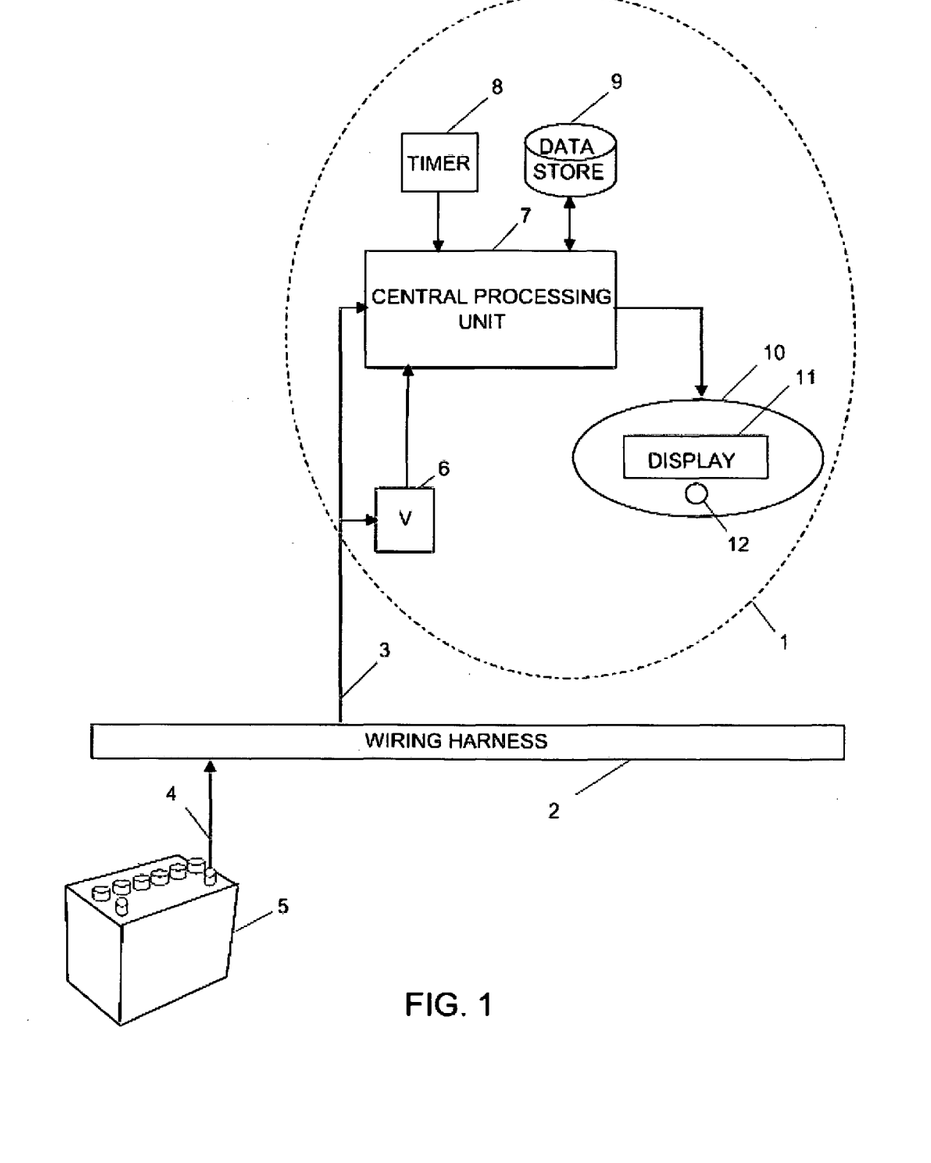
FIG. 1 is a block diagram of a single-function computer system that is dedicated to monitoring the state of the battery, calculating its health and making this information available to the vehicle operator by monitoring the vehicle battery's voltage.

FIG. 1 is a block diagram illustrating a single-function environment. Computer system 1 attaches to the vehicle's wiring harness 2 using wire 3. The wiring harness 2 includes a power wire 4 that is attached to the vehicle's battery 5. The power from the wiring harness 2 is used to power computer system 1 from wire 3. The power from the wiring harness 2 is also fed into voltage sensor 6 which allows central processing unit 7 to sample the vehicle's voltage at any instant in time. Thus, the wire 3 provides a means for electrically attaching to the vehicle's wiring harness 2 and a means for receiving electrical power from the wiring harness 2. Central processing unit 7 displays the sample information on display 11 of console 10 when so directed by the console control 12. By means specified in various software algorithms computer system 7 renders a profile of the current health of the battery. These algorithms make use of the history contained in data store 9. This history is made rich by a time profile whose creation by central processing unit 7 is facilitated by timer 8 and included with the voltage samples as saved in data store 9. The time profile permits the means by which the central processing unit 7 can, as an example, estimate driving time in automobiles based upon periodic changes in battery voltage. This in turn relates directly to the health and well being of the battery. Central processing unit 7 displays the battery health information on display 11 of console 10 when so directed by the console control 12. Under those conditions wherein bad battery health is detected, central processing unit 7 overrides console control 12 and causes the bad health information to be shown immediately and unconditionally to the operator on display 11. Thus, display 11 is a means for providing information to a vehicle operator based on the health of the battery.

In accordance with another embodiment, the present invention provides a single-function computer system that attaches to a vehicle's wiring harness at a point that is local to the location of the vehicle's operator but remote from the location of the battery and includes facilities added local to the vehicle's battery that provide battery current and battery temperature information.

Figure 2:
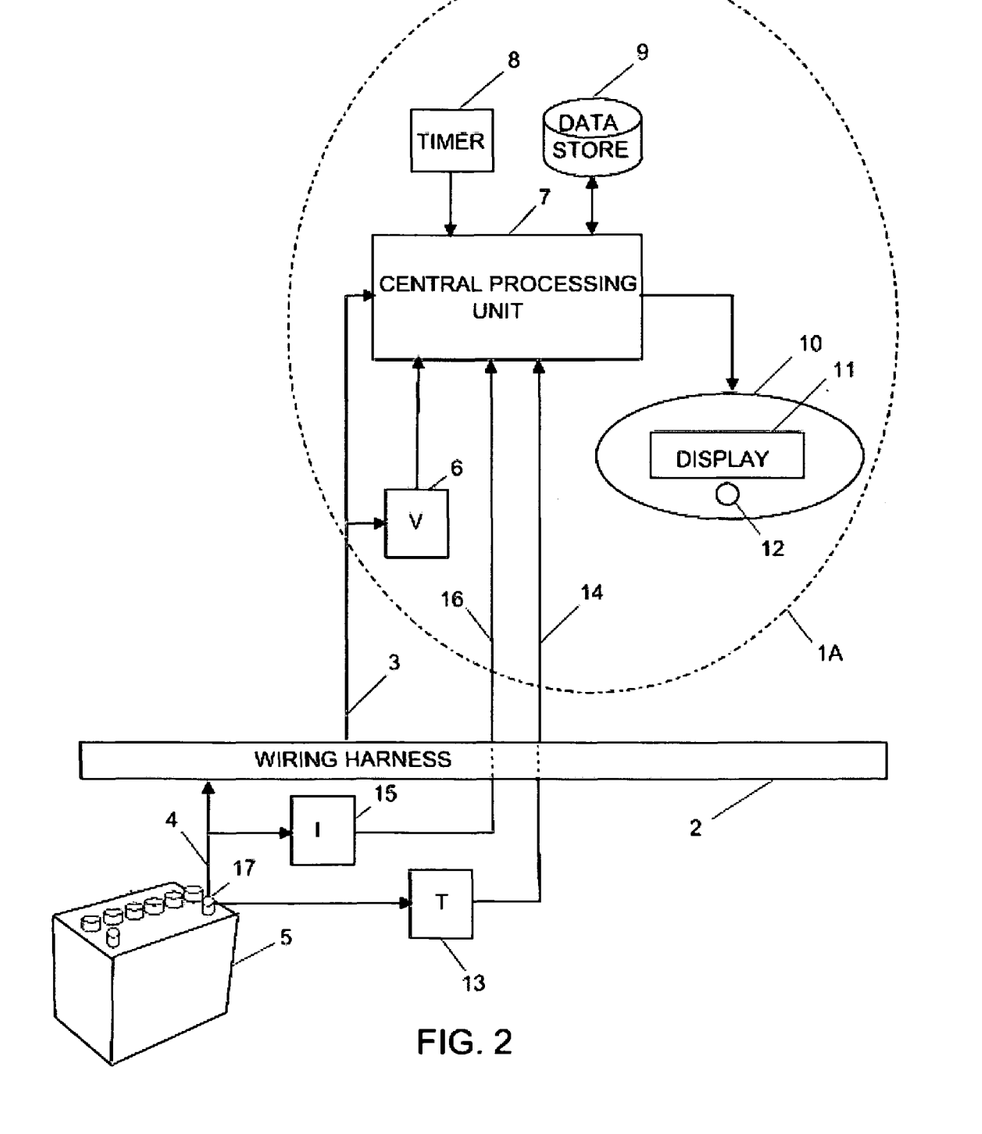
FIG. 2 is a block diagram of a single-function computer system that is dedicated to monitoring the state of the battery, calculating its health and making this information available to the vehicle operator by monitoring the vehicle battery's voltage, current and temperature.

FIG. 2 is a block diagram illustrating a single-function environment. Computer system 1A is similar to computer system 1 (FIG. 1) except it includes an attachment wire 16 to a battery current sensor 15 that is installed on or near the positive terminal 17 of battery 5. It also includes an attachment wire 14 to a battery temperature sensor 13 that is installed on or near battery 5. Central processing unit 7 samples the battery's voltage as provided by voltage sensor 6, the battery's current as provided by current sensor 15 and the battery's temperature as provided by temperature sensor 13. Central processing unit 7 displays the sampled voltage, current and temperature information on display 11 of console 10 when so directed by the console control 12. By means specified in various software algorithms computer system 7 renders a profile of the current health of the battery. These algorithms make use of the history contained in data store 9. This history is made rich by a time profile whose creation by central processing unit 7 is facilitated by timer 8 and included with the voltage, current and temperature samples as saved in data store 9. Central processing unit 7 displays the battery health information on display 11 of console 10 when so directed by the console control 12. Under those conditions wherein bad battery health is detected, central processing unit 7 overrides console control 12 and causes the bad health information to be shown immediately and unconditionally to the operator on display 11.

Figure 2A:
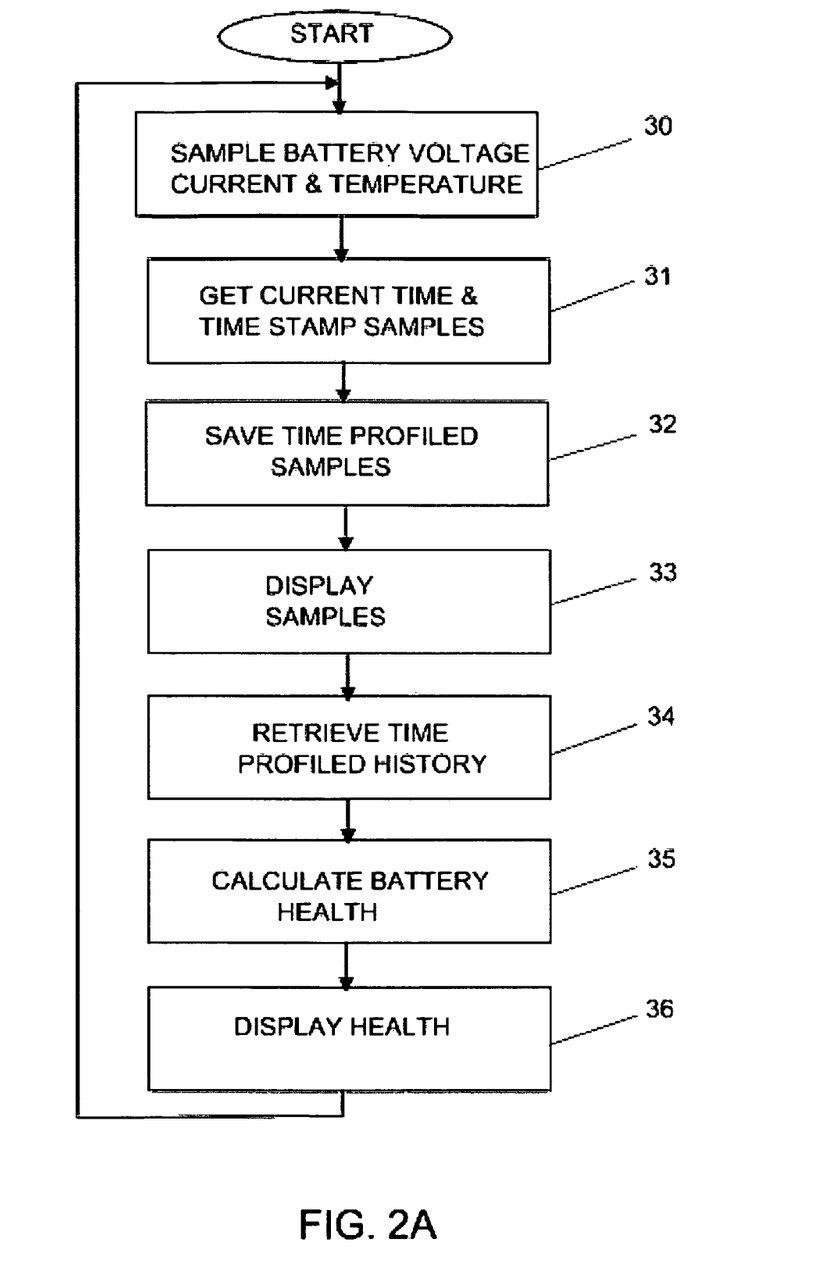
FIG. 2A is a flow chart illustrating the steps taken by the structural illustration of FIG. 2 as it collects battery data, calculates battery health and displays this information.

FIG. 2A is a flowchart illustrating the steps taken by computer system 1A (FIG. 2) in order to gather, analyze and display the current operating state and the rendered health of battery 5 (FIG. 2). In step 30 the current state of the battery is sampled. In step 31 the current time is obtained. In step 32 the current time is added to the battery samples and saved. The current operational state of the battery as defined by the battery samples taken in step 30 are displayed in step 33. In step 34 the history of the time profiled battery samples is made available in step 35 to a library of computer algorithms which provide the means by which the health of the battery is calculated. In step 36 the calculated health of the battery is displayed.

In accordance with yet another embodiment, the present invention provides a dual-function computer system that attaches to a vehicle's wiring harness at a point that is local to the location of the vehicle's operator but remote from the location of the battery and includes facilities added local to the vehicle's battery that provide battery temperature information. In addition to processing battery information this embodiment processes tire pressure information that it is provided by a wireless connection to tire pressure sensors.

Figure 3:
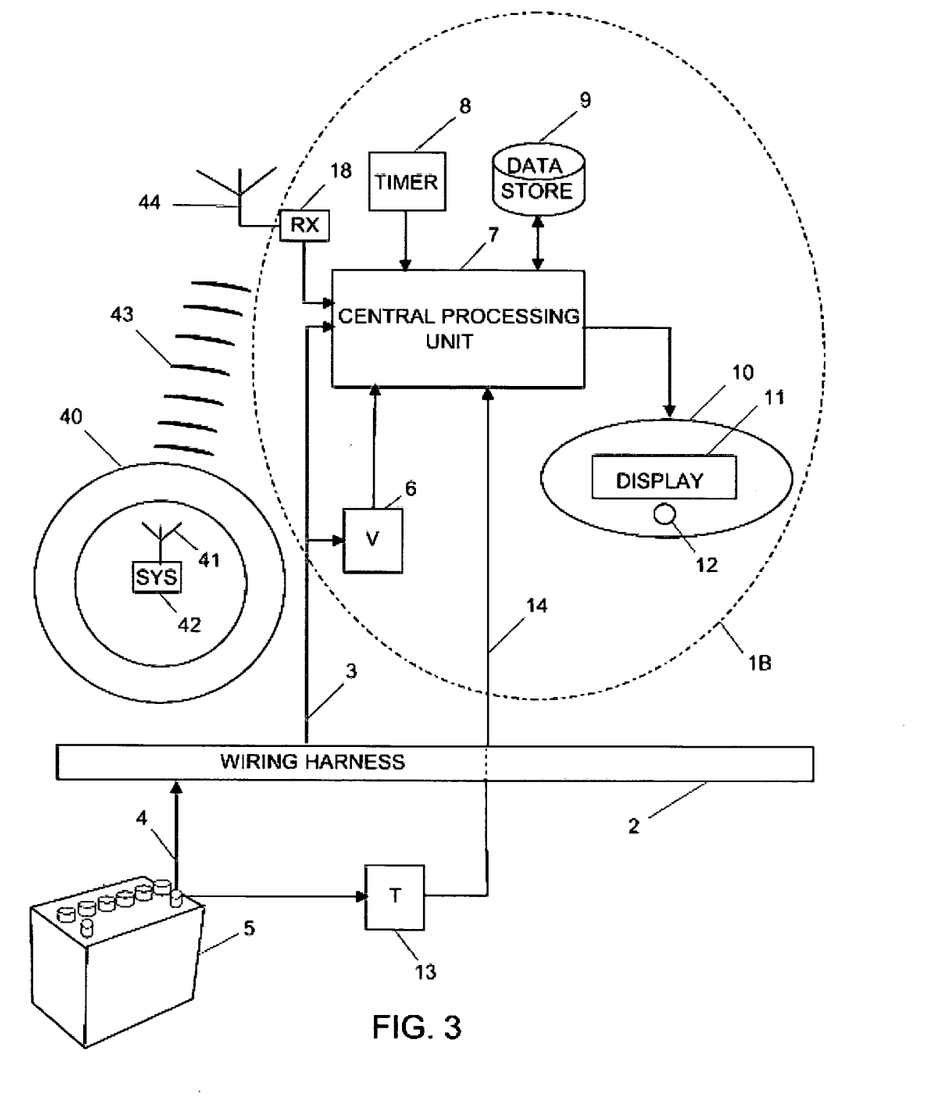
FIG. 3 is a block diagram of a dual-function computer system that monitors both the vehicle's battery and tire pressure.

FIG. 3 is a block diagram illustrating a dual-function environment. Computer system 1B is a dual-function computer system. It gathers, analyzes and displays battery information in the same manner as computer system 1A (FIG. 2) except in this embodiment battery current is not sampled. Computer system 1B also receives tire pressure information from computer system 42 mounted inside tire 40. This wireless information 43 is transmitted by computer system 42 using antenna 41. This wireless information 43 is received by antenna 44 and made available to central processing unit 7 by wireless transceiver 18. It is displayed on display 11 of console 10 when so directed by console control 12.

Figure 3A:
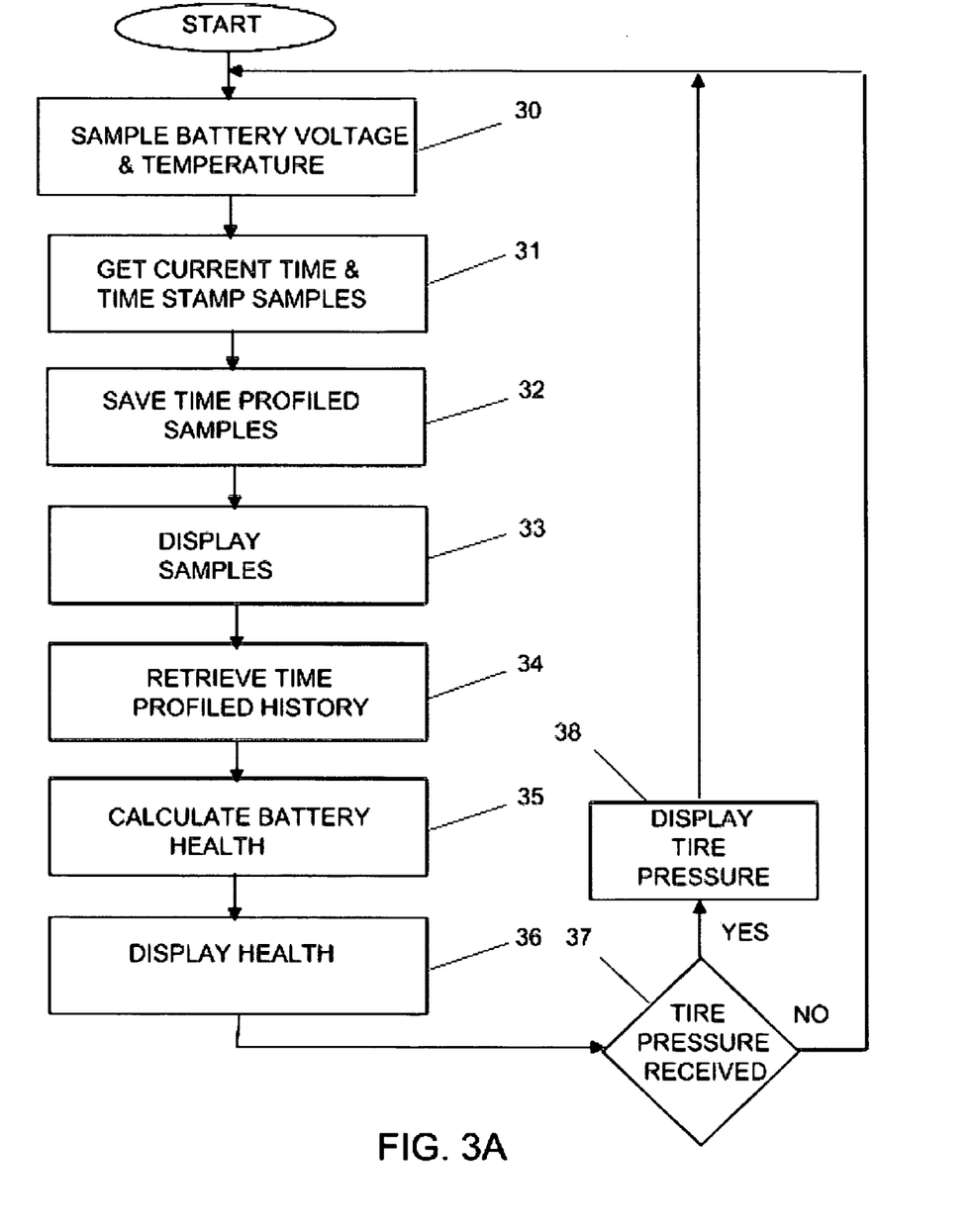
FIG. 3A is a flow chart illustrating the steps taken by the structural illustration of FIG. 3 as it monitors tire pressure and the vehicle's battery.

FIG. 3A is a flowchart illustrating the steps taken by computer system 1B (FIG. 3) in order to gather, analyze and display the current operating state along with the rendered health of battery 5 (FIG. 3) and to also collect and display tire pressure information. In step 30 the current state of battery 5 (FIG. 3) is sampled. In step 31 the current time is obtained. In step 32 the current time is added to the battery samples and saved. The current operational state of the battery as defined by the battery samples taken in step 30 are displayed in step 33. In step 34 the history of the time profiled battery samples is made available in step 35 to a library of computer algorithms which provide the means by which the health of the battery is calculated. In step 36 the calculated health of the battery is displayed. Program control is then directed to step 37 where a check is made to see if tire pressure information has been received on the wireless link. If tire pressure information has not been received program control is directed to step 30. If tire pressure information has been received, this information is displayed on the operator's console in step 38. Program control is then directed to step 30.

In accordance with yet another embodiment, the present invention provides a dual-function computer system that attaches to a vehicle's wiring harness at a point that is local to the location of the vehicle's operator but remote from the location of the battery and includes facilities added local to the vehicle's battery that provide battery temperature information. In addition to processing battery information this embodiment processes location, speed, direction and time information that it is provided by a microwave connection to a Global Positioning System satellite.

Figure 4:
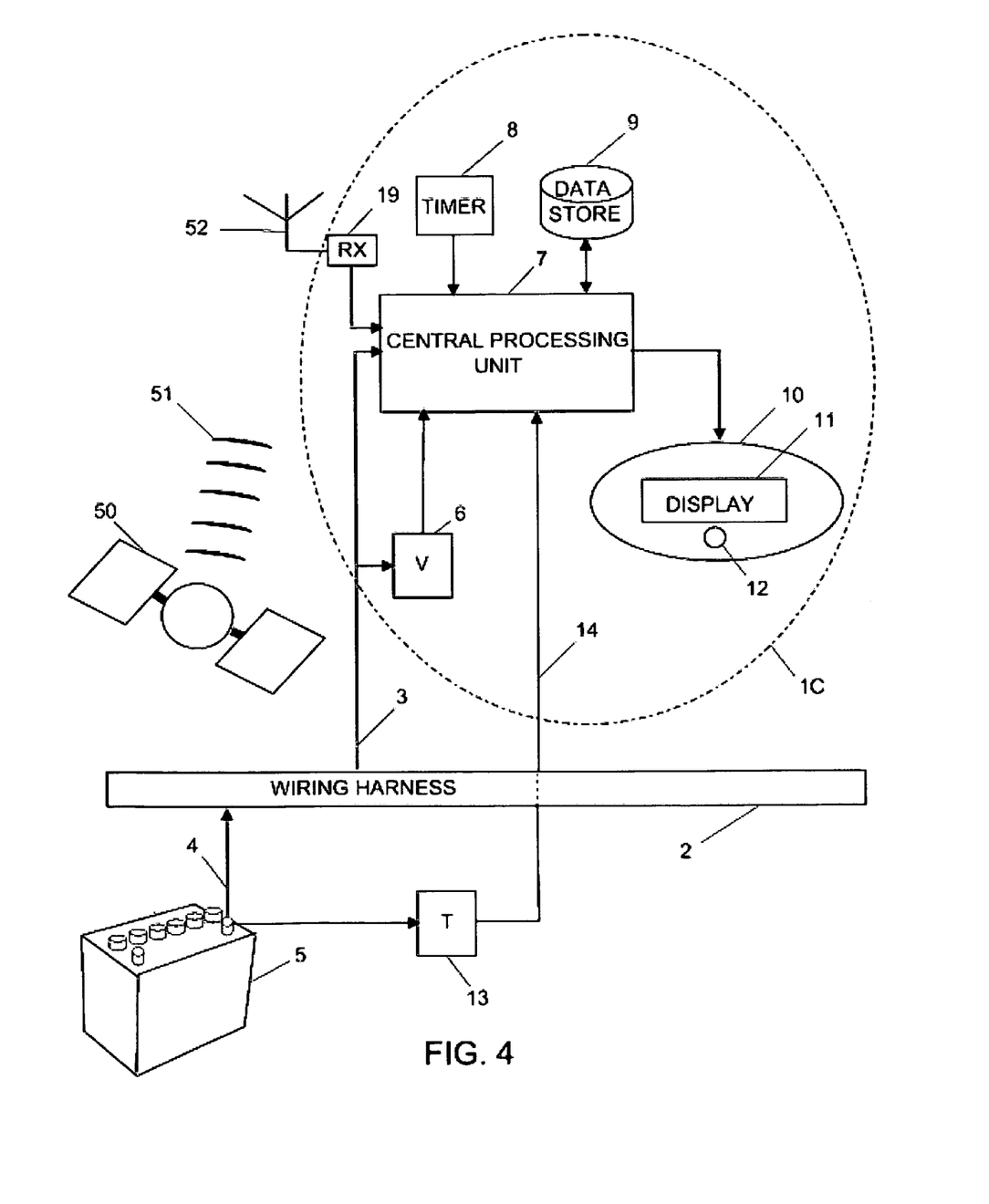
FIG. 4 is a block diagram of a dual-function computer system that monitors the battery and includes a global positioning system.

FIG. 4 is a block diagram illustrating a dual-function environment. Computer system 1C is a dual-function computer system. It gathers, analyzes and displays battery information in the same manner as computer system 1B (FIG. 3). Central processing unit 1C also receives location, speed, direction and time information from GPS satellite 50. The microwave transmitted information 51 is received by antenna 52 and made available to central processing unit 7 by microwave transceiver 19. The GPS information is analyzed by central processing unit 7 and then displayed on display 11 of console 10 when so directed by console control 12.

In accordance with still yet another embodiment, the present invention provides a dual-function computer system that attaches to a vehicle's wiring harness at a point that is local to the location of the vehicle's operator but remote from the location of the battery and includes facilities added local to the vehicle's battery that provide battery temperature information. In addition to processing battery information this embodiment includes an audio stereo sound system.

Figure 5:
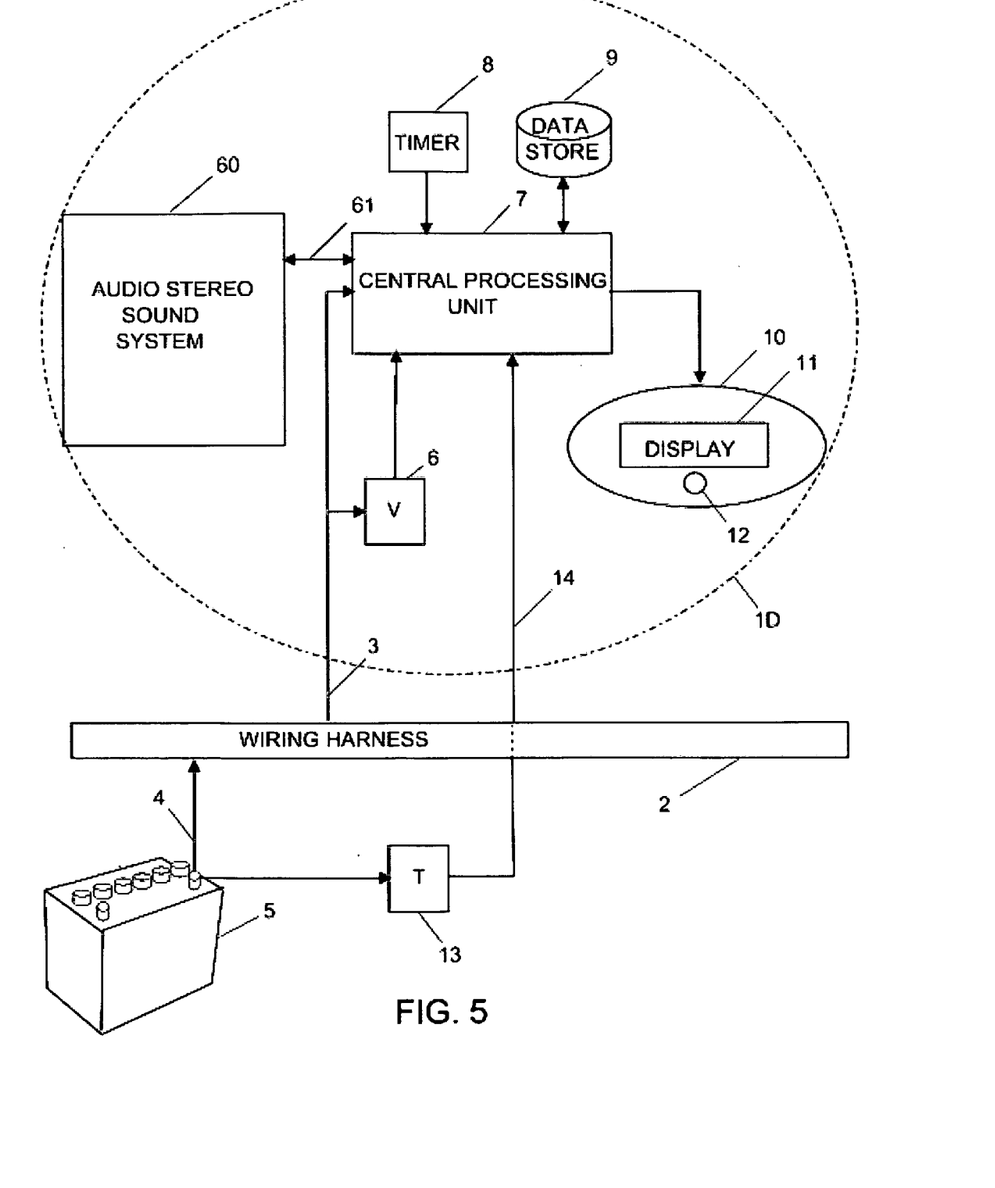
FIG. 5 is a block diagram of a dual-function computer system that monitors the battery and includes an audio stereo sound system.

FIG. 5 is a block diagram illustrating a dual-function environment. Computer system 1D is a dual-function computer system. It gathers, analyzes and displays battery information in the same manner as computer system 1B (FIG. 3). Central processing unit 1D also includes an audio stereo sound system 60 that includes an interface 61 to central processing unit 7 and utilizes console 10 as the means for providing operator control of the audio stereo sound system 60.

In accordance with still yet another embodiment, the present invention provides a dual-function computer system that attaches to a vehicle's wiring harness at a point that is local to the location of the vehicle's operator but remote from the location of the battery and includes facilities added local to the vehicle's battery that provide battery temperature information. In addition to processing battery information this embodiment includes a theft deterrent system.

Figure 6:
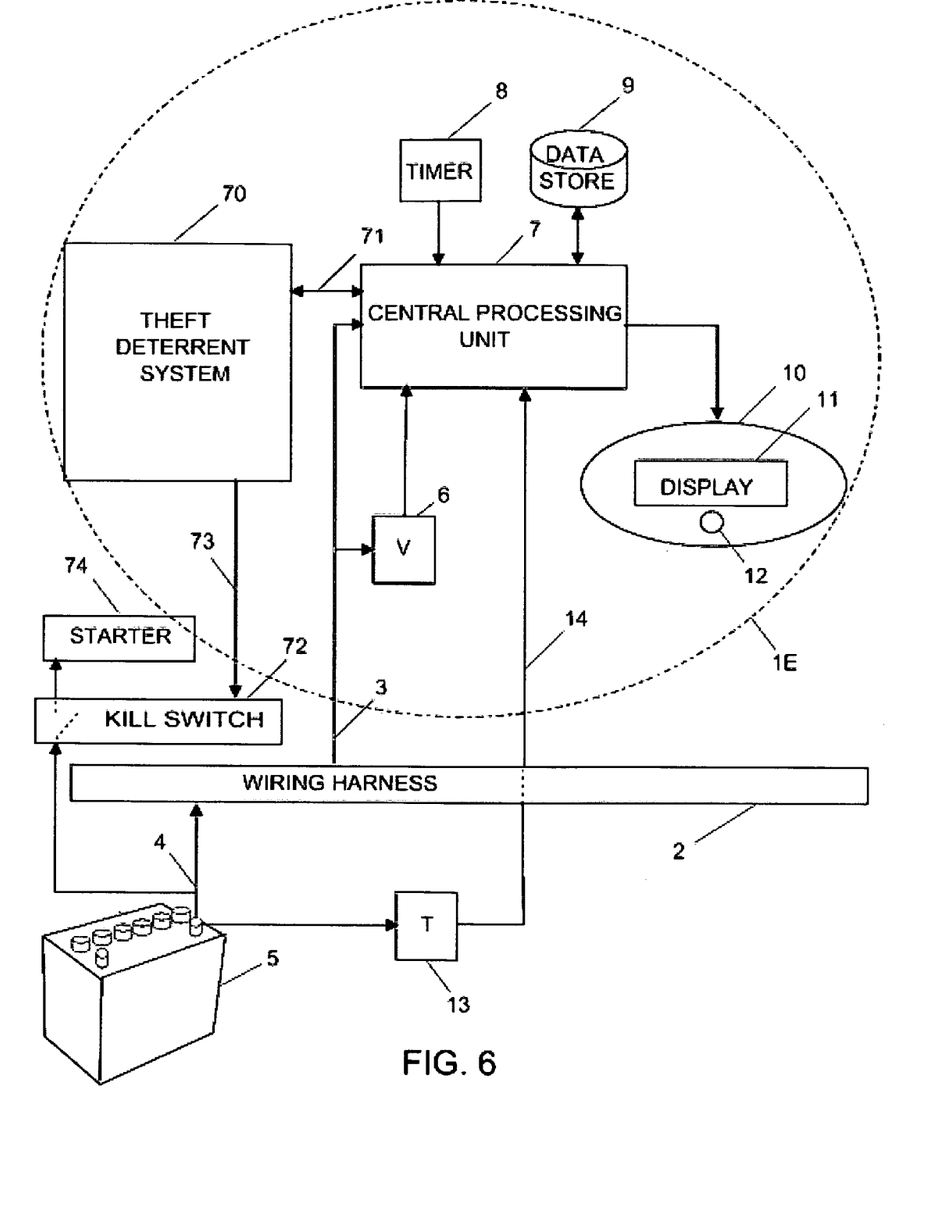
FIG. 6 is a block diagram of a dual-function computer system that monitors the battery and includes a theft deterrent system.

FIG. 6 is a block diagram illustrating a dual-function environment. Computer system 1E is a dual-function computer system. It gathers, analyzes and displays battery information in the same manner as computer system 1B (FIG. 3). Central processing unit 1E also includes a theft deterrent system 70 that includes an interface 71 to central processing unit 7 and utilizes console 10 as the means for providing operator control of the theft deterrent system 70. Included in the theft deterrent system 70 is a vibration sensor (not shown), an audible alarm (not shown) and connection 73 that controls kill switch 72 which in turn can render starter motor 74 inoperable by turning off power wire 4.

The foregoing descriptions of multiple embodiments of the present invention are by way of example, only, and other variations and modifications of the above-described embodiments are possible in light of the foregoing teachings. In particular FIG. 3 illustrates the dual-function computer system 1B whereby battery and tire pressure information are combined and FIG. 4 illustrates the dual-function computer system 1C whereby battery and GPS information are combined. A variation of these two embodiments could therefore be a single multifunction computer system that combines battery monitoring, tire pressure monitoring and GPS functionality into a single device. The important teaching of this example is that manufacturing costs and installation expenses are reduced by combining functionality inside the same unit.

What is claimed is:

1. A battery monitoring system for electrically engaging a wiring harness of a vehicle, said wiring harness electrically coupled to a terminal of said battery via a power supply line, said battery monitoring system comprising:

a conductor attachable to a wire of said wiring harness inside an operator compartment of said vehicle, said wire delivering power from said wiring harness to an accessory of said vehicle;

a voltage sensor coupled to sense a voltage on said conductor and being operative to generate voltage data indicative of a voltage on said wire;

memory operative to provide storage for said voltage data generated by said voltage sensor and for storing algorithms that, when executed, cause battery health data to be generated by comparing newly acquired voltage data with stored voltage data previously acquired from said voltage sensor;

a processing unit coupled to receive said newly acquired voltage data, said stored voltage data, and said algorithms and being operative to execute said algorithms to generate said battery health data;

a timer operative to provide time data; and a temperature sensor operative to provide temperature data; and wherein said memory is further operative to store said time data and said temperature data;

said processing unit is coupled to receive newly acquired time data and newly acquired temperature data each associated with said newly acquired voltage data and to receive stored time data and stored temperature data each associated with said stored voltage data; and said algorithms, when executed by said processing unit, cause said battery health data to be generated based solely on said newly acquired voltage data, said time data associated with said newly acquired voltage data, said temperature data associated with said newly acquired voltage data, said stored voltage data, said stored time data, and said stored temperature data.

2. The battery monitoring system of claim 1, further comprising a second sensor operative to generate second sensor data indicative of at least one operational characteristic of said battery.

3. The battery monitoring system of claim 2, wherein said second sensor is adapted to monitor said power supply line.

4. The battery monitoring system of claim 3, wherein said second sensor comprises a current sensor adapted to monitor electrical current through said power supply line.

5. The battery monitoring system of claim 1, wherein said processing unit is included in a secondary system having functionality different than battery monitoring.

6. The battery monitoring system of claim 5, wherein said secondary system is a navigation system.

7. The battery monitoring system of claim 5, wherein said secondary system is an audio system.

8. The battery monitoring system of claim 5, wherein said secondary system is a theft deterrent system.

9. The battery monitoring system of claim 5, wherein said secondary system is a tire pressure monitoring system.

10. The battery monitoring system of claim 5, wherein said secondary system is an aftermarket automotive component.

11. The battery monitoring system of claim 1, further comprising an operator interface accessible to an operator of said vehicle, said operator interface operative to receive information based on said battery health data from said processing unit and to provide said information to said operator.

12. The battery monitoring system of claim 1, further comprising:
   a housing adapted to be mounted within said operator compartment of said vehicle; and wherein
   said voltage sensor is disposed within said housing.

13. The battery monitoring system of claim 1, wherein said battery is an engine starter battery for said vehicle.

14. The battery monitoring system of claim 13, wherein said engine starter battery is a lead-acid starter battery.

15. A battery monitoring system for electrically engaging a wire that provides electrical power to an accessory of a vehicle from a wiring harness of a vehicle, said wiring harness being electrically coupled to a terminal of said battery via a power supply line, said battery monitoring system comprising:
   means for electrically attaching to said wire;
   a voltage sensor coupled to sense a voltage on said wire via said means for electrically attaching to said wire, said voltage sensor being operative to generate voltage data indicative of said voltage on said wire;
   memory operative to provide storage for said voltage data generated by said voltage sensor and for storing algorithms that, when executed, cause battery health data to be generated by comparing present voltage data with stored past voltage data;
   a processing unit coupled to receive said present voltage data, said stored past voltage data, and said algorithms from said memory and being operative to execute said algorithms to generate said battery health data;
   a housing adapted to be mounted within a passenger compartment of said vehicle;
   a timer operative to provide time data; and
   a temperature sensor operative to provide temperature data; and wherein said voltage sensor is disposed within said housing;
   said memory is further operative to store said time data and said temperature data;
   said processing unit is coupled to receive present time data and present temperature data each associated with said present voltage data and to receive stored past time data and stored past temperature data each associated with said stored past voltage data; and
   said algorithms, when executed by said processing unit, cause said battery health data to be generated based solely on said present voltage data, said present time data, said present temperature data, said stored past voltage data, said stored past time data, and said stored past temperature data.

16. The battery monitoring system of claim 15, further comprising a second sensor operative to generate second sensor data indicative of at least one operational characteristic of said battery.

17. The battery monitoring system of claim 16, wherein said second sensor is adapted to monitor said power supply line.

18. The battery monitoring system of claim 15, wherein said processing unit is included in a secondary system having functionality different than battery monitoring.

19. The battery monitoring system of claim 15, further comprising means for providing information to an operator in said passenger compartment of said vehicle based on said battery health data.

20. The battery monitoring system of claim 15, wherein said battery is an engine starter battery for said vehicle.

21. The battery monitoring system of claim 20, wherein said engine starter battery is a lead-acid starter battery.

* * * * *